(12) United States Patent
Ono et al.

(10) Patent No.: US 6,518,162 B2
(45) Date of Patent: Feb. 11, 2003

(54) METHOD FOR MANUFACTURING A SEMICONDUCTOR DEVICE

(75) Inventors: Atsushi Ono, Yamatokoriyama (JP); Takuro Asazu, Nara (JP); Shinji Yamaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/935,570

(22) Filed: Aug. 24, 2001

(65) Prior Publication Data
US 2002/0058412 A1 May 16, 2002

(30) Foreign Application Priority Data
Sep. 8, 2000 (JP) .......................... 2000-274081

(51) Int. Cl.$^7$ .............................. H01L 21/44; B08B 6/00
(52) U.S. Cl. ........................ 438/612; 438/613; 438/614; 134/1.2; 134/1.3
(58) Field of Search ................................ 438/612–617; 134/1–1.3

(56) References Cited

U.S. PATENT DOCUMENTS

| | | | | |
|---|---|---|---|---|
| 4,188,707 A | * | 2/1980 | Asano et al. | |
| 5,885,891 A | * | 3/1999 | Miyata et al. | |
| 6,367,486 B1 | * | 4/2002 | Lee et al. | |

FOREIGN PATENT DOCUMENTS

| | | |
|---|---|---|
| JP | 7-326848 A | 12/1995 |
| JP | 10-64870 A | 3/1998 |

* cited by examiner

*Primary Examiner*—Ha Tran Nguyen
(74) *Attorney, Agent, or Firm*—Nixon & Vanderhye, P.C.

(57) ABSTRACT

The present invention includes a step of forming an Ni bump by non-electrolytic plating in an opening of a protecting film having an insulating property formed on an electrode pad which is provided on a semiconductor substrate, and a step of removing a plating solution residue remaining in a gap between the Ni bump and the protecting film. The plating solution residue is removed by cleaning in a cleaning solution containing hydrogen peroxide, or by applying an ultrasonic wave in a cleaning solution such as pure water.

21 Claims, 5 Drawing Sheets

METHOD FOR MANUFACTURING A SEMICONDUCTOR DEVICE

FIELD OF THE INVENTION

The present invention relates to a method for manufacturing a semiconductor device. More specifically, the invention relates to a method for manufacturing a semiconductor device provided with protrudent electrodes used as an external wiring to make electrical connection with a conductive pattern formed on a circuit substrate.

BACKGROUND OF THE INVENTION

Recently, with advancement of smaller and higher-performance semiconductor devices, a semiconductor chip has been miniaturized and the number of terminals (connection terminals) has been increasing. In connection with this, pitches of the connection terminals are being made finer. A result of this is wide spreading use of packaging methods by which a semiconductor device is packaged in a tape carrier package (hereinbelow referred to as a TCP) by inner lead bonding (hereinbelow referred to as ILB) and packaged on a circuit substrate by direct flip-chip bonding with its face down. Further, like the ILB and the flip-chip bonding, the packaging methods by which fine pitch terminals can be connected at once regardless of the number of connection terminals are adopted by various semiconductors.

In order to realize these packaging methods, it is required to form a protrudent electrode (hereinbelow referred to as a bump) for connection on an electrode pad of a semiconductor chip.

Processes of manufacturing a bump in practical applications include a non-electrolytic bump process by which an Au (gold) bump or a solder bump is formed by electrolytic plating which utilizes electrocoating by electrolysis, and a wire bump process which utilizes wire bonding by metal fine lines.

The electrolytic plating bump process is advantageous because it provides high throughput by wafer batch processing, a large number of terminals, and finer pitch. However, the electrolytic plating bump process requires forming a barrier metal layer which is also used as a conductive film for electrolytic plating and forming a window in a bump forming portion by coating, exposuring, and developing a photoresist. Further, in the electrolytic plating bump process, since it is necessary to employ a step of forming the metal layer for electrolytic plating and a masking step using a photoresist for forming a bump selectively, the step of forming the bump is complicated. Further, in the electrolytic plating bump process, it is required to use such equipment as sputtering equipment and photo equipment other than electrolytic plating equipment. Thus, there is a problem that equipment investment becomes very large.

On the other hand, in the wire bump process, bumps are formed successively on respective electrode pads with wire bonder. Thus, in the wire bump process, throughput is low and it is difficult to increase the number of terminals. Further, in realizing finer pitch, while the limit of the pitch of the electrode pad in the electrolytic plating bump process is about bump width+5 $\mu$m (for example, when the bump width is 20 $\mu$m, the pitch width is 25 $\mu$m), the finest pitch of the electrode pad in the wire bump process is about 75 $\mu$m. Note that, since it is possible to form the bump only with the wire bonder in the wire bump process, there is an advantage that equipment investment can be suppressed.

As described above, semiconductor devices having a bump have been manufactured conventionally by making use of characteristics of the respective methods for forming a bump. However, recently, an non-electrolytic plating bump process is being developed as a new method for forming a bump.

The non-electrolytic plating bump process is to perform non-electrolytic plating selectively on an electrode pad made of or mainly made of Al (aluminum) which is formed on the semiconductor substrate in a semiconductor device. Further, in the non-electrolytic plating bump process, unlike the electrolytic bump process, it is not required to form a conductive film for plating by the sputter equipment or form a window using a photoresist in a bump forming portion by photo equipment. Thus, the process can be simplified and less equipment investment is required. Further, the non-electrolytic plating bump process can realize lower cost while having the advantageous characteristics of higher throughput by wafer batch processing, and finer pitches, which are common characteristics of plating bump processes.

Here, as the non-electrolytic plating bump process in the case where Ni (nickel) is used as the main component of the bump, Ni/Au plating bump process is described below with reference to FIG. 5(a) to FIG. 5(e).

First, as shown in FIG. 5(a), an electrode pad 2 made of or mainly made of Al is formed on a semiconductor substrate 1. Further, a protecting film 3 (insulating protecting film) having an insulating property is stacked on the electrode pad 2 so as to cover the electrode pad 2. Next, a portion of an upper surface of the electrode pad 2 is exposed, for example, by etching a portion of the protecting film 3 on the electrode pad 2. Thus, the protecting film 3 having an opening 3a on the electrode pad 2 is patterned.

Next, as shown in FIG. 5(b), an oxide film 4 on the surface of the electrode pad 2 in the opening 3a of the protecting film 3 and a residual thin film (not shown) of the protecting film 3 are removed. Thereafter, a zincate process is performed by a substitution reaction of Al and Zn (zinc), and as shown in FIG. 5(c), Al on the surface of the electrode pad 2 is substituted with Zn. Thus, a Zn layer 5 is formed on the surface of the electrode pad 2.

Next, the semiconductor substrate 1 processed by the zincate process is immersed in a non-electrolytic plating solution to carry out the non-electrolytic plating process. For example, the semiconductor substrate 1 on which the Zn layer 5 is formed is immersed in a non-electrolytic Ni plating solution, so as to carry out the non-electrolytic Ni plating process by a non-electrolytic Ni plating reaction. In the non-electrolytic Ni plating reaction, first, Zn of the Zn layer 5 and Ni undergo a substitution reaction and Ni is deposited, thereby substituting Zn with Ni. Thereafter, as shown in FIG. 5(d), Ni is deposited progressively by the self catalytic reaction in which the substituted Ni itself acts as a catalyst, thus forming an Ni bump 6.

In the case where the bump is made of a material which forms an oxide film on its surface like the Ni bump 6, an Au thin film is formed on the surface of the bump so as to prevent oxidation on the surface of the resulting bump.

In this case, after non-electrolytic Ni plating is finished, for example, displacing Au plating is performed so as to prevent oxidation on an Ni surface of the Ni bump 6. Thus, as shown in FIG. 5(e), Au is deposited on the Ni surface, and an Au layer 9 is formed on the Ni bump 6. This completes the non-electrolytic Ni/Au plating bump process.

As described above, in forming the non-electrolytic Ni plating bump, it is not required to form a conductive film for plating by sputter equipment, or form a window in a bump forming portion using a photoresist by photo equipment. Thus, forming the non-electrolytic Ni plating bump has an advantage that less equipment investment is required. Further, since inexpensive Ni is used as a main material and throughput is good, forming the non-electrolytic Ni plating bump costs less than forming the Au bump by the electrolytic plating bump process.

However, as a result of study by the inventor of the present invention, it was found that the bump formed by the non-electrolytic plating bump process poses a problem in a pressure cooker test (hereinbelow referred to as PCT), which is an index of guaranteed quality.

In the non-electrolytic plating bump process, the non-electrolytic plating process is performed selectively only on the electrode pad 2 in the opening 3a of the protecting film 3. Here, the reaction of the non-electrolytic Ni plating proceeds as the Zn (or Pd) of the Zn layer 5 which is formed by substitution with Al is substituted with Ni on the electrode pad 2 exposed in the opening 3a of the protecting film 3 made of the oxide film etc. Thereafter, the reaction proceeds by the self catalytic reaction in which Ni itself becomes a catalyst to deposit Ni. Thus, Ni deposited by non-electrolytic Ni plating does not form any chemical bond except with the Ni which was substituted in advance or deposited already, and Ni is deposited only on Ni. Therefore, as shown in FIG. 5(d) and FIG. 5(e) and FIG. 6, since Ni has no bond with the protecting film 3, there exists a narrow gap 7 between the Ni bump 6 and the protecting film 3 facing the Ni bump 6.

Thus, as shown in FIG. 5(d) and FIG.5(e) and FIG. 6, non-electrolytic Ni plating solution remains as plating solution residue 8 (component of the non-electrolytic Ni plating solution) in the narrow gap 7. As a result, the Ni bump 6 is formed with the plating solution residue 8 remaining in the narrow gap 7.

A semiconductor device manufactured with the plating solution residue 8 remaining in the narrow gap 7, for example, was packaged in a TCP and was examined by PCT (121° C., $2.026 \times 10^5$ Pa) which is an item of reliability evaluation. The result shows that the remaining plating solution residue 8 melted and leaked from the narrow gap 7 in about 100 hours, and a leaking defect between adjacent terminals occurred. Thus, the plating solution residue 8 causes unreliability of the semiconductor device.

The plating solution residue 8 remaining in the narrow gap 7 cannot be removed easily and completely by normal pure water cleaning.

Japanese Unexamined Patent Publication No. 326848/1995 (Tokukaihei 7-326848)(published date: Dec. 12, 1995) discloses the following technique as a technique for cleaning a plated substrate concerning a method for manufacturing a gold plating mold substrate used as a chip on board substrate (hereinbelow referred to as COB). When a circuit (a wiring pattern) is formed by underlayer plating and gold plating on the COB substrate which is provided with pits for installing components, a brightener which is included in the plating solution for the underlayer plating is absorbed in a plating film formed by the gold plating. In this case, a plating surface for wire bonding is stained, and a wire bonding ability on the plating surface suffers. In the foregoing publication, the plating surface for wire bonding is cleaned by an aqueous solution including hydrogen peroxide and ammonia so as to prevent the wire bonding ability from degrading.

As described above, in a semiconductor device for flip chip packaging and ILB, it is required to form a bump on an electrode pad by non-electrolytic plating. In forming a bump, a narrow gap is created between the bump (Ni plate) and a protecting film, and plating solution residue exists in the gap. However, the foregoing Japanese Unexamined Patent Publication No. 326848/1995 does not disclose removing plating solution residue remaining in the narrow gap or a method for this.

Further, in the electrolytic plating bump process, after a conductive film for electrolytic plating is formed on a wafer, a window is formed using a photoresist to form a bump selectively. After the bump is formed, the photoresist is removed. Therefore, the plating solution residue remaining between the photoresist and the bump is removed completely in a process of removing the photoresist. Thus, a narrow gap exists between a bump and a protecting film, and a component of a plating solution remains as residue in the narrow gap. This is a problem intrinsic to the structure of the non-electrolytic plating bump process.

SUMMARY OF THE INVENTION

It is an object of the present invention, from the viewpoint of the foregoing problems, to provide a method for manufacturing a highly reliable semiconductor device which can be provided at low cost while realizing high throughput, finer pitch, and improved moisture resistance. More specifically, according to the object of the present invention, when forming a protrudent electrode of the semiconductor by non-electrolytic plating by which a high throughput and finer pitch can be realized and the protrudent electrode can be formed at low cost, the present invention is to remove plating solution residue in a narrow gap between the protrudent electrode and a protecting film, which is intrinsic to the non-electrolytic plating used to form the protrudent electrode, so that moisture resistance of the semiconductor device can be improved. As a result, reliability of the semiconductor device can be improved.

A manufacturing method of a semiconductor device according to the present invention, to achieve the foregoing object, includes two steps. A first step is a step of forming a protrudent electrode (for example, a nickel bump) by non-electrolytic plating in an opening of an insulating protecting film formed on an electrode pad provided on a semiconductor substrate. A second step is a step of removing plating solution residue in a gap between the protrudent electrode and the insulating protecting film.

The protrudent electrode is formed selectively by non-electrolytic plating on the electrode pad formed on the semiconductor substrate. Further, unlike the case where the protrudent electrode is formed by electrolytic plating, it is not required to form a conductive film for plating by sputter equipment or a window in a bump forming portion using a photoresist. Therefore, by forming the protrudent electrode by non-electrolytic plating, steps can be simplified and equipment investment can be reduced. Therefore, forming the protrudent electrode by non-electrolytic plating can reduce cost while having advantageous characteristics such as high throughput and finer pitch.

On the other hand, the protrudent electrode formed by non-electrolytic plating is formed selectively on the electrode pad in the opening of the insulating protecting film, so that there is no chemical bond between the resulting protrudent electrode and the insulating protecting film. For example, in the case where the protrudent electrode is formed by non-electrolytic nickel plating in the opening, the protrudent electrode is formed as nickel is deposited on nickel by the self catalytic reaction. Thus, a narrow gap exists between the protrudent electrode and the insulating protecting film facing the protrudent electrode. Further, a plating solution is trapped in the narrow gap in the process of forming the protrudent electrode as the plating layer grows by the non-electrolytic plating. In the case where a semiconductor device manufactured with the plating solution residue remaining in the narrow gap is examined by PCT (121° C., 2.026×10$^5$ Pa), the remaining plating solution residue melts and leaks from the narrow gap, and a leaking defect between terminals is caused.

Thus, it is very effective to form the protrudent electrode by non-electrolytic plating and remove trouble-making plating solution residue in the narrow gap between the protrudent electrode and the insulating protecting film which occurs in forming the protrudent electrode by non-electrolytic plating. That is, compared with the case where the protrudent electrode is formed by electrolytic plating, steps can be simplified and equipment investment can be reduced. Thus, the foregoing measure can reduce cost while having advantageous characteristics such as high throughout and finer pitch. Further, the foregoing measure can prevent defects such as a leak between terminals, so that moisture resistance of the semiconductor device can be improved. As a result, reliability of the semiconductor device can be improved.

For a fuller understanding of the nature and advantages of the invention, reference should be made to the ensuing detailed description taken in conjunction with the accompanying drawings.

DESCRIPTION OF THE EMBODIMENTS

FIRST EMBODIMENT

An embodiment according to the present invention is described as follows based on FIG. 1(*a*) to FIG. 1(*f*) through FIG. 4.

Figure 1:
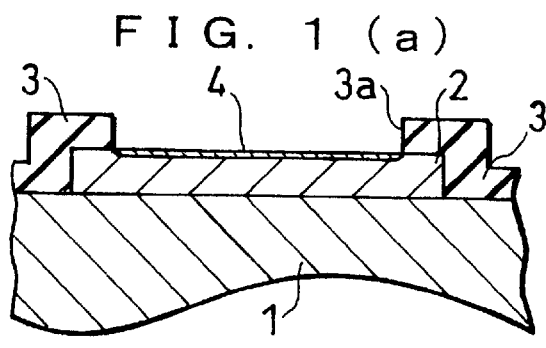
FIG. 1(*a*) to FIG. 1(*f*) are cross sectional views showing manufacturing steps of a semiconductor device according to an embodiment of the present invention.
Figure 1:
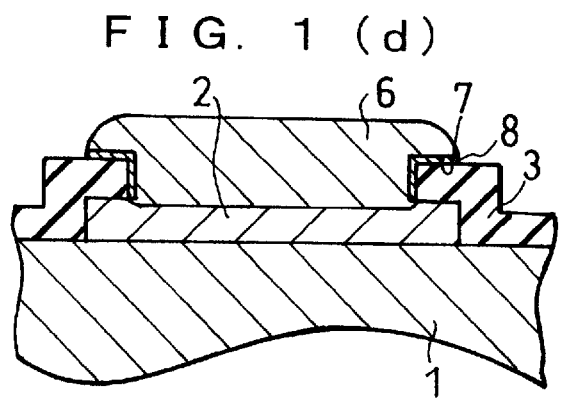
Figure 1:
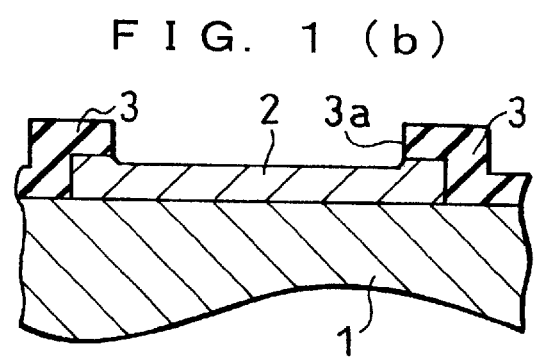
Figure 1:
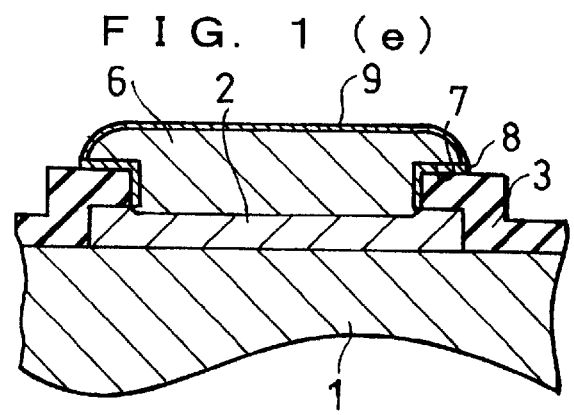
Figure 1:
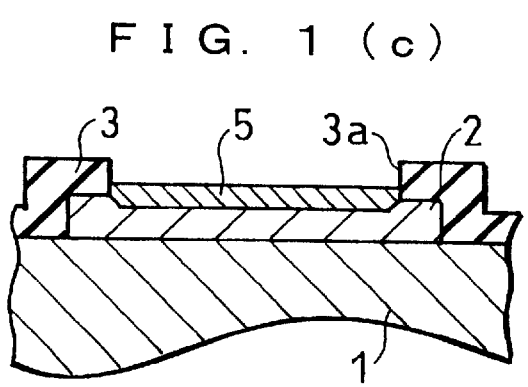
Figure 1:
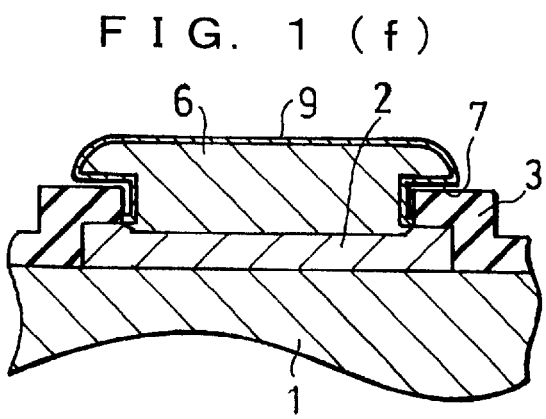

FIG. 1(*a*) to FIG. 1(*f*) are cross sectional views showing manufacturing steps of a semiconductor device according to the present embodiment. The semiconductor device according to the present embodiment includes an electrode pad formed on a semiconductor substrate, a protecting film having an insulating property (insulating protecting film), and a protrudent electrode (bump). The protecting film has an opening. The protecting film is provided on the electrode pad so that a portion of the electrode pad is exposed in the opening. The protrudent electrode is formed in the opening of the protecting film so as to cover the opening. In the present embodiment, forming the protrudent electrode is described based on an example in which the protrudent electrode is formed by non-electrolytic Ni (nickel) plating. The manufacturing steps of the semiconductor device are described in order as follows.

FIG. 1(*a*) is a cross sectional structural view of the semiconductor device in an early stage of an non-electrolytic Ni plating bump process. In the non-electrolytic Ni plating bump process, as shown in FIG. 1(*a*), an electrode pad 2 made of or mainly made of Al is formed on a semiconductor substrate 1. A protecting film 3 having an insulating property (insulating protecting film) is stacked on the electrode pad 2 so as to cover the electrode pad 2. Further, a portion of an upper surface of the electrode pad 2 is exposed, for example, by etching a portion of the protecting film 3 on the electrode pad 2. In this way, the protecting film 3 having an opening 3*a* on the electrode pad 2 is patterned.

Next, as shown in FIG. 1(*b*), as a preceding process of forming the protrudent electrode, wet etching is performed by immersing the semiconductor substrate 1 in an aqueous solution of sulfuric acid, phosphoric acid, or sodium hydroxide etc. By this process, an oxide film 4 (Al oxide film) on the surface of the electrode pad 2 in the opening 3*a* of the protecting film 3 and a residual thin film (not shown) of the protecting film 3 are removed. Thereafter, pure water cleaning is performed. Note that, it is possible to remove the oxide film 4 and the residual thin film (not shown) of the protecting film 3 also by a plasma dry process.

Next, as shown in FIG. 1(*c*), a zincate process (Zn substitution reaction process) by a substitution reaction of Al and Zn (zinc) is performed, so that Al on the surface of the electrode pad 2 is substituted by Zn. By this process, a Zn layer 5 is formed on the surface of Al of the electrode pad 2. This process is performed because Al and Ni on the electrode pad 2 do not react with each other directly and a preceding process is required. The preceding process of Ni plating includes the zincate process using Zn and an activation process using Pd (palladium).

In the case of the zincate process, Al is substituted with Zn, and then Zn is substituted with Ni. In the zincate process, the semiconductor substrate 1 after removing the oxide film 4 etc. is immersed in a zincate process solution containing mainly zinc oxide and sodium hydroxide to perform a wet process. Then, Al on the surface of the electrode pad 2 is substituted with Zn in the zincate process solution, so that Zn deposits on the electrode pad 2. As a result, the Zn layer S is formed. The Zn layer 5 prevents re-oxidation of the surface of the electrode pad 2. Further, the Zn layer acts as a starting point of reaction of non-electrolytic Ni plating.

On the other hand, the Pd activation process is based on inter-molecular interaction. The present embodiment describes the case where the zincate process is performed, in consideration of such factors as adhesion and selectivity etc. Note that, the Pd activating process may be performed instead of the zincate process to bind Pb on the surface of the electrode pad 2. Which process to use is suitably decided according to, for example, adhesion, selectivity, or material of the electrode pad 2 etc. and is not restricted particularly. For example, when the electrode pad 2 is a Cu (copper) pad, it is impossible to perform the zincate process. Thus, in this case, the Pd activation process is performed.

Next, after pure water cleaning is performed, the semiconductor substrate 1 subjected to the zincate process or the Pd activation process is immersed in a non-electrolytic Ni plating solution containing mainly nickel sulfate and sodium hypophosphite. In this manner, the non-electrolytic Ni plating process is performed as an non-electrolytic plating process, and as shown in FIG. 1(d), Ni bump 6 (Ni plating film) is formed on the electrode pad 2. In the non-electrolytic plating bump process, the non-electrolytic plating process is performed selectively only on the electrode pad 2 in the opening 3a of the protecting film 3. In the non-electrolytic Ni plating process, Zn and Ni of the Zn layer 5 on the electrode pad 2 undergo a substitution reaction and Ni is deposited, so that Zn is substituted with Ni. Thereafter, the self catalytic reaction of the substituted Ni acting as a catalyst itself promotes deposit of Ni, that is, the non-electrolytic Ni plating reaction, so that a protrusion of Ni which becomes the Ni bump 6 is formed. Thereafter, pure water cleaning is performed.

Note that, when the Pd activation process is performed as the preceding process instead of the zincate process, Pd and Ni undergo a substitution reaction and Ni is deposited, so that Pd is substituted with Ni. Thereafter, the self catalytic reaction of the substituted Ni acting as a catalyst itself promotes deposit of Ni, so that a protrusion of Ni which becomes the Ni bump 6 is formed.

Next, by a displacing Au plating process, the semiconductor substrate 1 on which the Ni bump 6 is formed is immersed in a substitution Au plating solution containing mainly gold sodium to perform a wet process. By performing the process, as shown in FIG. 1(e), an Au layer 9 (Au thin film layer) is formed on the Ni bump 6.

When the bump is made of a material which forms an oxide film on its surface like the Ni bump 6, a noble metal coating (noble metal thin film) such as an Au thin film is formed as an antioxidant film on a surface of the bump (metal bump) to prevent oxidation on the surface of the formed bump.

Immersing the semiconductor substrate 1 in the substitution Au plating solution initiates the substitution reaction of Ni and Au, and Au is deposited on the surface of Ni. Theoretically, when the surface of Ni is covered with Au, the substitution reaction is completed. However, in reality, when the semiconductor substrate 1 is immersed in the substitution Au plating solution for a long time, the underlying Ni elutes due to pin windows and the like, and adherence strength of the Au film suffers. Thus, substitution Au plating should be performed in a proper time. Since the substitution Au plating is performed based on only the substitution reaction in which Ni on the surface of the Ni bump 6 is substituted with Au, the Au layer 9 is extremely thin. Thereafter, pure water cleaning is performed. In the present embodiment, pure water cleaning was performed for about 5 minutes.

As described above, when the Ni bump 6 is formed by non-electrolytic plating, the Ni deposited by non-electrolytic Ni plating does not form any chemical band except with Ni which was substituted in advance or deposited already. That is, Ni is deposited only on Ni. Thus, as shown in FIG. 1(d) and FIG. 1(e), FIG. 5(d) and FIG. 5(e) and FIG. 6, a narrow gap 7 exists between the Ni bump 6 and the protecting film 3 facing the Ni bump 6.

Thus, as shown in FIG. 1(d) and FIG. 1(e), and FIG. 5(d) and FIG. 5(e), and FIG. 6, the Ni bump 6 and the Au layer 9 are formed with a plating solution residue 8 remaining. Note that, the plating solution residue 8 includes nickel sulfate and sodium hypophosphite and the like. The plating solution residue 8 remaining in the narrow gap 7 cannot be removed easily or completely by performing normal pure water cleaning.

In the present embodiment, an ultrasonic wave is applied in a solution (cleaning solution) in which the semiconductor substrate 1 is immersed. That is, the ultrasonic wave which propagates through the solution (cleaning solution) makes the solution reach deep inside the narrow gap 7, so that the ultrasonic wave removes the plating solution residue 8 remaining in the narrow gap 7 between the Ni bump 6 and the protecting film 3 by vibration.

In the ultrasonic cleaning, it is important to select a range of ultrasonic wave. When the ultrasonic wave used for cleaning is set at a frequency range of, for example, several ten kHz, the semiconductor device is severely damaged due to cavitation. In this case, the Ni bump 6 is missed or an Al wiring on the semiconductor substrate 1 is damaged.

By setting the frequency of the ultrasonic wave to 950 kHz or above, damage to the semiconductor device by cavitation can be suppressed. Further, it is possible to efficiently remove the plating solution residue 8 remaining in the narrow gap 7 between the Ni bump 6 and the protecting film 3.

Although an upper limit value of the frequency of the ultrasonic wave is not particularly restricted, it is preferable that the frequency of the ultrasonic wave is set at the optimum value according to size of the target to be removed, the plating solution residue 8.

Figure 2:
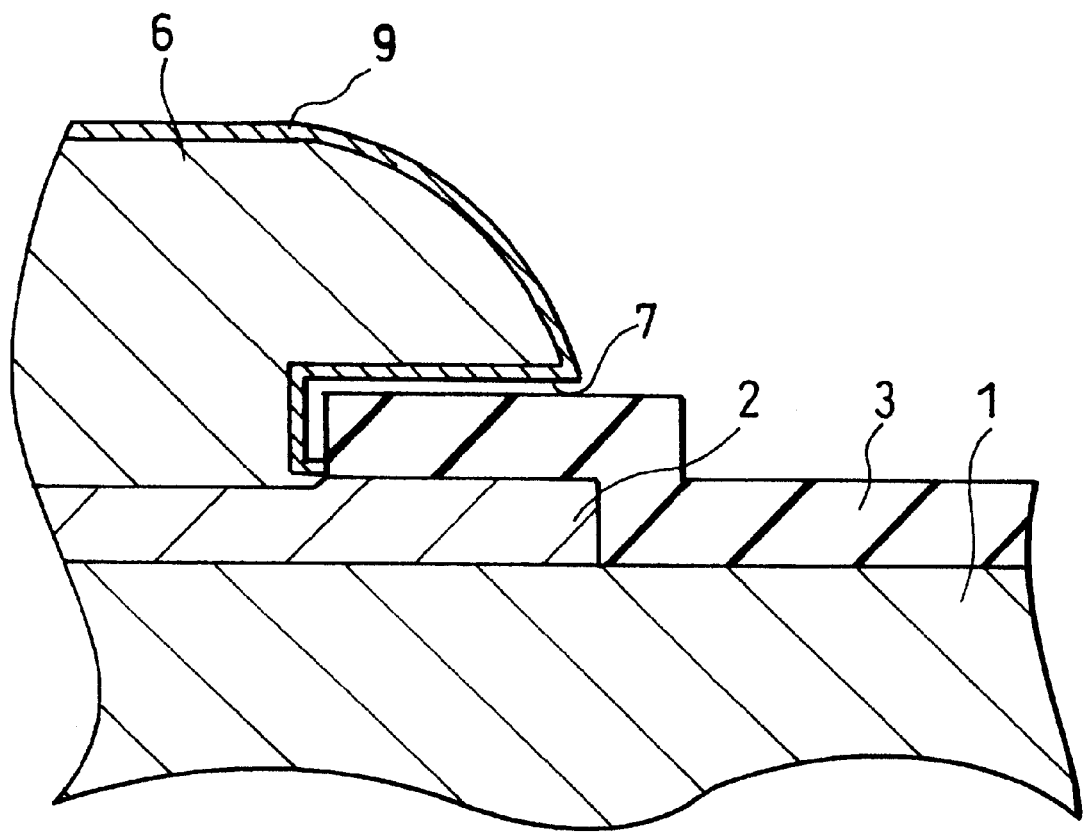
FIG. 2 is an enlarged view of a main portion schematically showing an arrangement of a semiconductor device according to an embodiment of the present invention.

The ultrasonic cleaning was performed by immersing the semiconductor substrate 1 with the Ni bump 6 and the Au layer 9 (semiconductor device shown in FIG. 1(e)) in pure water. The cleaning was performed for ten minutes by the ultrasonic wave with intensity of 4.5 to 5.0 W/cm$^2$ and at a frequency of 950 kHz in a mega sonic range. By this process, as shown in FIG. 1(f) and FIG. 2, it was possible to obtain a semiconductor device with the Au layer 9 formed on the surface of the Ni bump 6 in which the plating solution residue 8 remaining in the narrow gap 7 between the Ni bump 6 on the electrode pad 2 and the protecting film 3 was removed.

In the foregoing process of manufacturing the semiconductor device, pure water was used as a cleaning solution. However, the cleaning solution is not necessarily restricted to the pure water. As long as the plating solution residue can be removed, the cleaning solution need not be restricted to specific solution. Thus, all types of solution used to clean the semiconductor device in the process of manufacturing the semiconductor device can be used as the cleaning solution. As the cleaning solution, a solution which can dissolve components of the plating solution residue 8 is suitably used. When pure water is used as the cleaning solution, the effect of cleaning can be improved by including a surfactant.

In the step of removing the plating solution residue 8, by including a surfactant in the cleaning solution (pure water), surface tension of the cleaning solution is reduced by the surfactant. Since surface tension is reduced, the cleaning solution can reach deep inside the narrow gap 7 between the Ni bump 6 and the protecting film 3 (more strictly, as shown in FIG. 1(f), the narrow gap between the Au layer 9 on the surface of the Ni bump 6 and the protecting film 3 in the case where the Au layer 9 is formed on the surface of the Ni bump 6 by substitution Au plating). In this way, it is possible to efficiently remove the plating solution residue 8 remaining in the narrow gap between the Ni bump 6 and the protecting film 3. As a result, more effective cleaning can be realized. Thus, by using a mixed solution of the surfactant, particularly a nonionic surfactant and pure water as the cleaning solution, cleaning effect can be improved. Particularly, the reason the nonionic surfactant is used as the surfactant is to avoid recontamination caused by ions in the cleaning solution during cleaning. Note that, content of the foregoing surfactant is not particularly restricted, as long as the surfactant reduces the surface tension of pure water.

As described above, when a bump is made of a material, such as Ni, which forms an oxide film on its surface, the surface of the bump can be prevented from being oxidized by forming the Au layer 9 on the surface of the bump (in this case, the Ni bump 6) by substitution Au plating. In this case, the narrow gap 7 exists between the bump and the protecting film 3. Thus, when the Au layer 9 is formed on the surface of the bump by substitution plating, plating solution used to form the Au layer 9 flows into the narrow gap 7 and remains therein. Thus, after the step of forming the Au layer 9, the step of removing the plating solution residue 8 is performed. This removes all the plating solution residue 8 in the step of forming the bump (the Ni bump 6) and in the step of forming the Au layer 9. Thus, a highly reliable semiconductor device can be manufactured, and the plating solution residue 8 can be removed efficiently.

Note that, the foregoing described the case where all the plating solution residue 8 remaining in the narrow gap 7 in the step of forming the Ni bump 6 and in the step of forming the Au layer 9 is removed at once by performing the step of removing the plating solution residue 8 after the step of forming the Au layer 9. However, when, a metal or a metal compound coating which is formed in the opening 3a of the protecting film 3 on the electrode pad 2 by non-electrolytic plating does not form an oxide coating like Au, the plating solution residue 8 of the non-electrolytic Ni plating solution which was trapped in the narrow gap 7 in the step of forming the Ni bump 6 can be removed before the substitution Au plating. Thereafter, the substitution Au plating is performed and the plating solution residue 8 of the substitution Au solution which was trapped in the narrow gap 7 in the step of forming the Au layer 9 is removed, so that the plating solution residue 8 remaining in the gap 7 can be removed. When a metal or a metal compound coating which is formed in the opening 3a of the protecting film 3 on the electrode pad 2 by non-electrolytic plating forms an oxide coating like Ni, it is preferable that the Au layer 9 is formed as an antioxide film before the oxide coating is formed.

The foregoing completes forming the bump on the electrode pad 2. A bump like this can be mounted in a TCP (tape carrier package) by ILB (inner lead bonding), or mounted by flip-chip using anistropic conductive resin. Further, regardless of the number of connection terminals, fine pitch terminals can be connected altogether at once.

Next, the following is a description of a case where the semiconductor device obtained in the present embodiment is applied to a TCP.

The semiconductor device (semiconductor chip) and a conductor pattern (circuit substrate) are connected by an Au/Sn eutectic alloy of Au of the Au on the bump of the semiconductor device, that is, the Au layer 9 on the Ni bump 6 and Sn (tin) on the conductor pattern. However, an inner lead section of the TCP is plated with Sn, when the thickness of the Au layer 9 of the semiconductor device is about 0.05 m$\mu$, as in the case where the Au layer 9 is formed by substitution Au plating, an eutectic of Au/Sn cannot be formed sufficiently. Thus, the thickness of Au in substitution Au plating is not enough to form a sufficient eutectic for connection. Therefore, manufacture of the TCP described below used a semiconductor device which was formed by non-electrolytic Au plating as follows. After the foregoing step, the semiconductor substrate 1 (the semiconductor device) was immersed in a non-electrolytic Au plating solution containing mainly gold sodium sulfite to perform a wet process, and pure water cleaning was performed thereafter, thus forming the Au layer 9 having about 1 $\mu$m thickness on the Ni bump 6.

Both the substitution Au plating solution and the non-electrolytic Au plating solution contain gold sodium sulfite as a main component. However, the non-electrolytic Au plating solution includes a reducing agent. Thus, in non-electrolytic Au plating, Au deposits continuously by the charge supplied by the reducing agent contained in the non-electrolytic Au plating solution. On the other hand, in substitution Au plating, there is no charge supplied by the reducing agent, and the reaction proceeds only by substitution by transfer of charges between Ni on the outermost surface of the Ni bump 6 and Au. Thus, the outermost surface of the Ni bump 6 in contact with the plating solution (substitution Au plating solution) is merely substituted with Au.

Next, the ultrasonic cleaning is performed again to remove the plating solution residue 8 of the non-electrolytic Au plating solution which entered between the Ni bump 6 and the protecting film 3. In this way, it was possible to obtain a semiconductor device provided with the Ni/Au bump in which the plating solution residue 8 in the narrow gap 7 between the Ni bump 6 and the protecting film 3 was removed and the Au layer 9 which was thick enough to form Au/Sn eutectic alloy was formed.

Next, the semiconductor device and the conducive pattern were pressed against each other for about one second by a bonding tool heated to about 500° C., and they were connected to each other by the with Au/Sn eulectic alloy. Thereafter, resin sealing was performed to obtain the TCP using the semiconductor device of the present embodiment.

In order to confirm the effect (effect of the present invention) of removing the plating solution residue 8 in the narrow gap 7 between the Ni bump 6 (Ni bump 6 having the Au layer 9 thereon: Ni/Au bump) and the protecting film 3, the TCP is examined by a PCT (pressure cooker test) by which the TCP was preserved at 121° C. and 2.026×10$^5$ Pa (humidity was 96% at the temperature of 121° C. and the pressure of 2.026×10$^5$ Pa). Further, an electrical test was performed at 100 hours interval. The result is as follows. In a semiconductor device whose plating solution residue 8 had not been removed (uncleaned device), the plating solution residue 8 melted and leaked in 100 hours, causing a leaking defect between terminals. This contrasts to the TCP obtained in the present embodiment which showed no leaking defect between terminals which is brought about by melting and leaking of the plating solution residue 8, even after 300 hours.

Further, concerning the semiconductor device obtained by the foregoing method, a bump shear strength and an inner lead strength after ILB were examined, and a stress test based on a temperature cycle was performed. The result is that the strength did not degrade, compared with the case where the bump is formed by the electrolytic plating bump process. Further, it was confirmed that defects brought about by the step of removing the plating solution residue 8 such as damage to the bump (the Ni/Au bump 6 formed by the foregoing step, that is, the Ni bump having the Au layer 9 thereon) in the ultrasonic cleaning did not occur.

Figure 3:
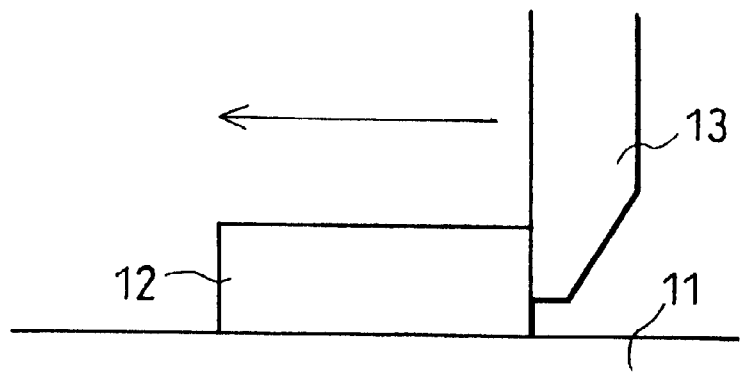
FIG. 3 is an explanatory drawing schematically showing a technique of measuring a bump shear strength.

FIG. 3 is an explanatory drawing schematically showing a method of measuring the bump shear strength. In FIG. 3, the form of the bump (Ni/Au bump in the present embodiment) is simplified. Further, FIG. 4 is an explanatory drawing schematically showing a method of measuring the inner lead strength. In FIG. 4, the form of the bump (Ni/Au bump in the present embodiment) is simplified.

The bump shear strength is a measure of estimating adhesion of the bump. As shown in FIG. 3, a force is exerted on a bump 12 (the Ni/Au bump formed by the foregoing step, that is, the Ni bump 6 having the Au layer 9 thereon) which is formed on the semiconductor substrate 11 (the semiconductor substrate 1) by a shearing tool 13 in a direction parallel to the semiconductor substrate 11. In this way, a shearing strength of the bump in a horizontal direction is measured.

Figure 4:
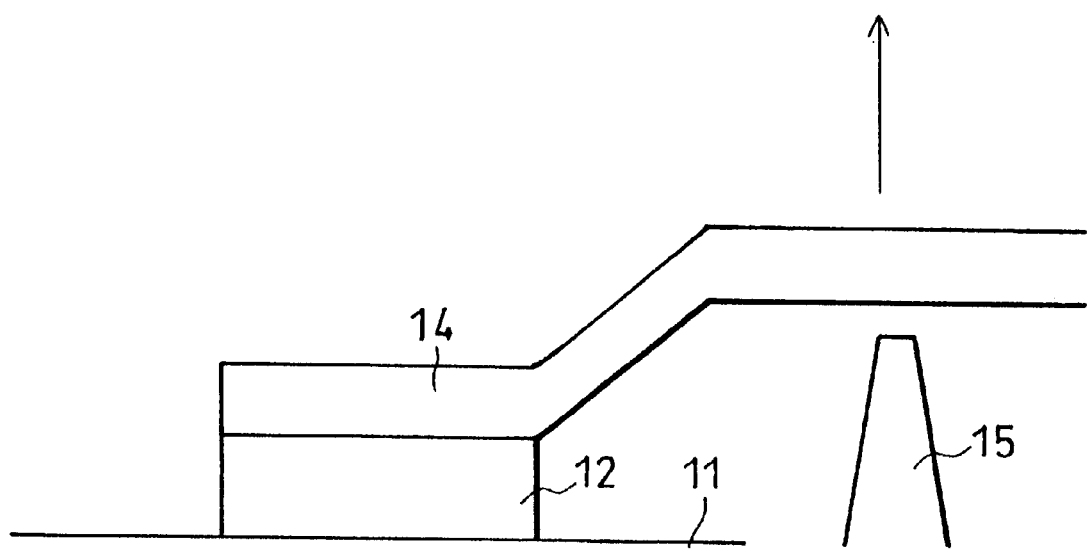
FIG. 4 is an explanatory drawing schematically showing a technique of measuring an inner lead strength.
Figure 5:
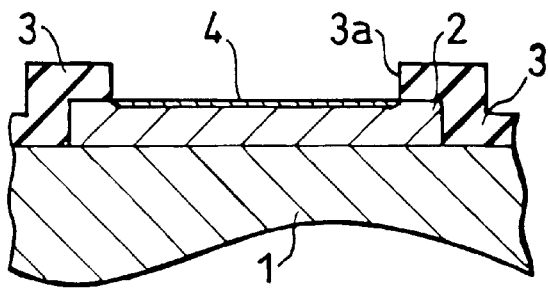
FIG. 5 (*a*) to FIG. 5 (*e*) are cross sectional views showing manufacturing steps of a conventional semiconductor device.
Figure 5:
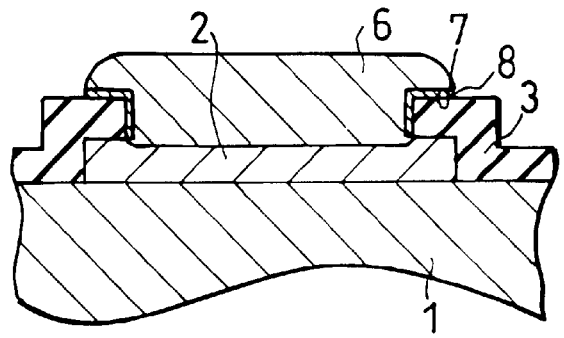
Figure 5:
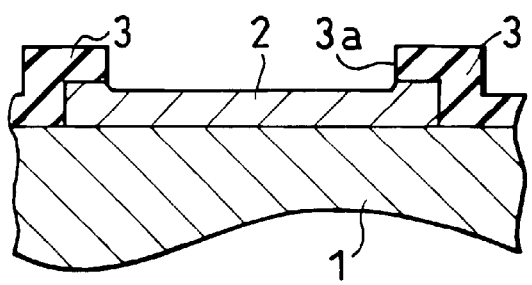
Figure 5:
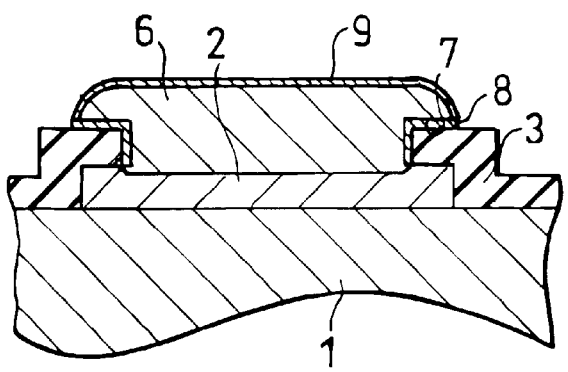
Figure 5:
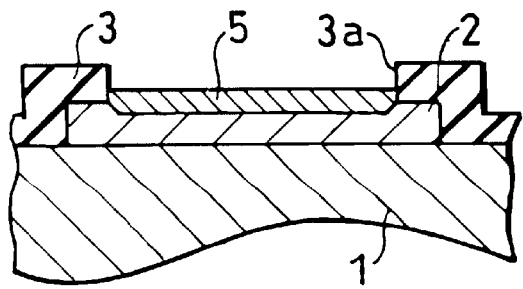
Figure 6:
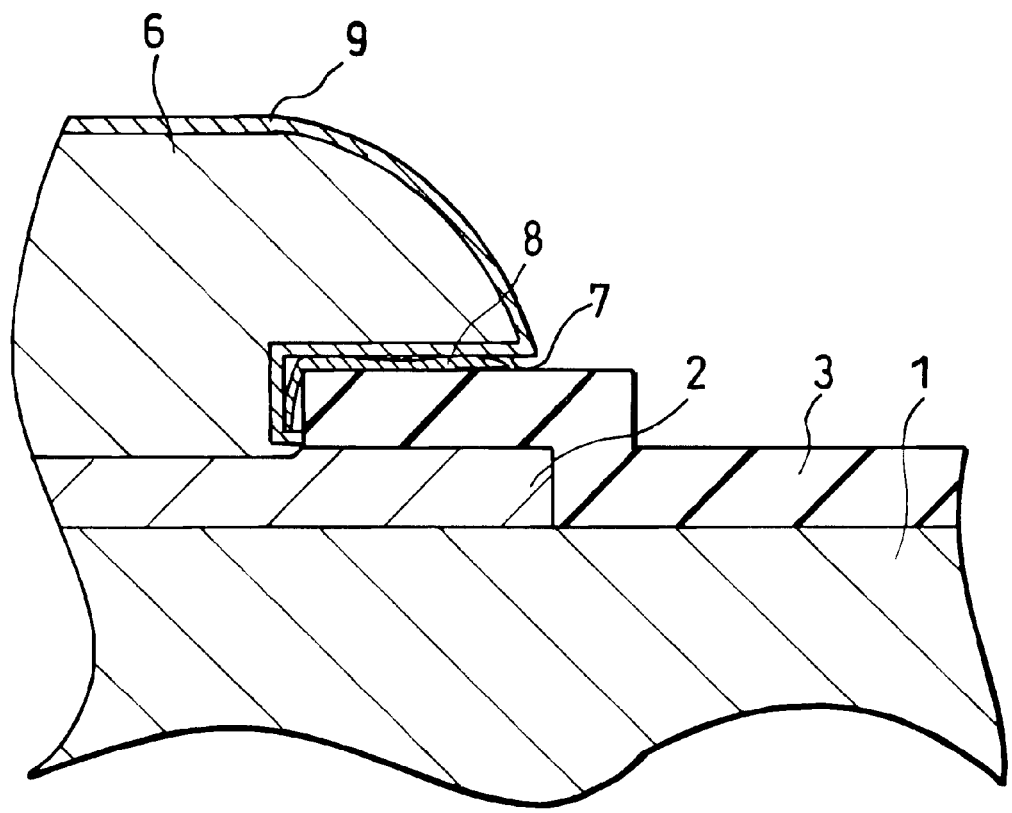
FIG. 6 is an enlarged view of a main portion schematically showing an arrangement of a conventional semiconductor device.

Further, as shown in FIG. 4, the inner lead strength after the ILB is measured as follows. A bump 12 (the Ni/Au bump formed by the foregoing step, that is, the Ni bump 6 having the Au layer 9 thereon) formed on the semiconductor substrate 11 (the semiconductor substrate 1) is connected to an inner lead 14. In the vicinity of the bump 12, the inner lead 14 is pushed upward from below the inner lead 14 in a direction perpendicular to the semiconductor substrate 1, for example, by a tool 15, so as to indirectly measure breaking strength of the bump 12 in a vertical direction.

As described above, a method for manufacturing the semiconductor device according to the present embodiment is to manufacture a semiconductor device including an electrode pad formed on a semiconductor substrate; an insulating protecting film, having an opening, formed on the electrode pad so that a portion of the electrode pad is exposed in the opening; and a protrudent electrode which is formed in the opening of the insulating protecting film so as to cover the opening (a metal bump formed by non-electrolytic plating (NiP (nickel phosphide), NiB (nickel boride) etc.) or the foregoing metal bump on which a noble metal coating such as Au thin film is formed), and the method includes a step of forming the protrudent electrode on the opening of the insulating protecting film formed on the electrode pad provided on the semiconductor substrate by non-electrolytic plating; and a step of removing a plating solution residue remaining in a gap between the protrudent electrode and the insulating protecting film.

According to the method, the protrudent electrode is formed selectively by non-electrolytic plating on the electrode pad formed on the semiconductor substrate. Further, unlike the case where the protrudent electrode is formed by electrolytic plating, it is not required to form a conductive film for plating by sputter equipment or form a photoresist window in a bump forming portion by a photo device. Therefore, with the foregoing method, steps can be simplified and equipment investment can be reduced. Thus, cost can be reduced while having the advantage of high throughput and finer pitch.

Further, when the protrudent electrode is formed by non-electrolytic plating, the plating solution residue remains in a gap between the protrudent electrode and the insulating protecting film in the step of forming the protrudent electrode. According to the foregoing method, by removing the plating solution residue which brings about defects, moisture resistance can be improved and defects such as a leak between terminals can be prevented. Thus, a highly reliable semiconductor device can be manufactured.

As a result, it is possible to provide the highly reliable semiconductor device manufactured by non-electrolytic plating whose manufacturing cost is reduced substantially compared with a conventional electrolytic plating bump process.

In the present embodiment, an ultrasonic wave is applied in a solution (cleaning solution), so that the plating solution residue in the gap between the protrudent electrode and the insulating protecting film is removed by the action of the ultrasonic wave traveling in the solution (cleaning solution).

The plating solution residue remaining in the gap between the protrudent electrode and the insulating protecting film cannot be removed easily by normal pure water. Thus, as described in the present embodiment, for example, after plating, pure water cleaning is performed, followed by ultrasonic cleaning. According to the method, the plating solution residue remaining in the gap between the protrudent electrode and the insulating protecting film which cannot be removed by normal pure water cleaning can be removed easily and efficiently by the action of the ultrasonic wave traveling in the solution (cleaning solution). In this case, as the solution (cleaning solution), a mixed solution of surfactant and pure water is used suitably. Further, by removing the plating solution residue by the ultrasonic cleaning, it is possible to obtain an advantage that the plating solution residue can be removed by using the solution which can be used easily like pure water as the cleaning solution.

Note that, in the present embodiment, in manufacture of the TCP using the semiconductor device, the manufacturing steps were adopted. That is, first, after forming the Au layer 9 as the Au thin film by substitution Au plating, the plating solution residue 8 remaining in the gap 7 between the Ni bump 6 having the Au layer 9 and the protecting film 3 (that is, the gap between the Au layer 9 formed on the surface of the Ni bump 6 and the protecting film 3) was removed. Further, the Au layer 9 having a 1 μm thickness was formed by non-electrolytic Au plating. Thereafter, the ultrasonic cleaning was performed again. Note that, after performing non-electrolytic Au plating, it is not necessarily required to perform the plating solution residue removing operation (ultrasonic cleaning).

The reason for this is as follows. When the Ni bump 6 is formed by non-electrolytic Ni plating, plating solution remains in the narrow gap formed between Ni (Ni bump) and the protecting film 3 with growth of Ni. That is, as the Ni grows, the plating solution accumulates gradually. However, in the non-electrolytic Au plating process after forming the Ni bump 6, the plating solution is in contact with only a surface of the bump, and this hinders the plating solution from flowing into the gap 7 between the Ni bump 6 (Ni/Au bump) having the Au layer 9 and the protecting film 3. Further, when the plating solution residue 8 is removed by performing the ultrasonic cleaning with pure water prior to the non-electrolytic Au plating process as described above, the pure water occupying the gap 7 hinders the non-electrolytic Au plating solution from entering into the gap. Further, when the Au layer 9 is formed by non-electrolytic Au plating, Au deposited by non-electrolytic Au plating clogs an entrance of the gap 7. Thus, after performing non-electrolytic Au plating, instead of the ultrasonic cleaning, normal pure water cleaning such as immersing the semiconductor device in pure water or running pure water through the semiconductor device may be performed.

However, when the Au layer 9 is formed by non-electrolytic Au plating, Au deposited by non-electrolytic Au plating clogs an entrance of the gap 7. Thus, it becomes difficult to remove the plating solution residue 8 from the gap 7 after performing non-electrolytic Au plating. Particularly, as described later in an embodiment, it becomes difficult to remove the plating solution residue 8 by immersing the semiconductor in the cleaning solution. Thus, as described above, also in the case where the Au layer 9 having about a 1 μm thickness is formed on the Ni bump 6 by non-electrolytic Au plating after performing the substitution Au plating, it is preferable that the step of removing the plating solution residue is performed after performing substitution Au plating.

Thus, when the protrudent electrode formed by non-electrolytic plating is made of a material which forms an oxide coating, it is preferable that the method for manufacturing the semiconductor device further includes a step of forming a metal thin film for forming a noble metal thin film (for example, a noble metal coating such as a gold thin film) by substitution plating on the protrudent electrode, that is, or a surface of the protrudent electrode formed by non-electrolytic plating, and the step of removing the plating solution residue is performed after performing the step of forming a noble metal thin film.

As a result, it is possible to remove the plating solution residue which was trapped in the gap when forming the protrudent electrode. Thus, a highly reliable semiconductor device can be manufactured and the plating solution residue can be removed efficiently.

Further, when the protrudent electrode formed by the non-electrolytic plating is made of a material which forms an oxide coating, it is preferable that the method for manufacturing the semiconductor device further includes a step of forming a noble metal thin film on a surface of the protrudent electrode by non-electrolytic plating, and the step of removing the plating solution residue is performed before performing the non-electrolytic plating in the step of forming a noble metal thin film.

In this manner, when the noble metal thin film is formed on the surface of the protrudent electrode by non-electrolytic plating, the step of removing the plating solution residue is performed prior to the non-electrolytic plating which is performed in the step of forming a noble metal thin film, so that it is possible to remove the plating solution residue which was trapped in the gap when forming the protrudent electrode. Thus, a highly reliable semiconductor device can be manufactured and the plating solution residue can be removed efficiently.

SECOND EMBODIMENT

Another embodiment according to the present invention is described as follows. Note that, in the present embodiment, differences between the first embodiment and the present embodiment is mainly described. Further, members which have the same functions as the members used in the first embodiment are given the same reference numerals, and explanations thereof are omitted.

The foregoing embodiment described the method for removing the plating solution residue remaining in the narrow gap between the protrudent electrode and the insulating protecting film by applying the ultrasonic wave. The present embodiment describes a method for removing the plating solution residue remaining in the narrow gap between the protrudent electrode and the insulating protecting film by cleaning with a cleaning solution.

In the present embodiment, a cleaning solution used to remove the plating solution residue 8 is a solution which contains at least hydrogen peroxide. By the hydrogen peroxide contained in the cleaning solution, the cleaning solution enters the narrow gap between the protrudent electrode and the insulating protecting film. In this way, it is possible to melt and remove the plating solution residue such as nickel sulfate or sodium hypophosphite which was trapped when performing non-electrolytic plating. Thus, even without the ultrasonic cleaning, it is possible, with the use of the cleaning solution, to remove the plating solution residue remaining in the narrow gap between the protrudent electrode and the insulating protecting film only by immersing a target semiconductor device in the cleaning solution. In this case, it is not required to use a ultrasonic wave generator, which is advantageous in further reducing equipment investment.

Although content of hydrogen peroxide contained in the cleaning solution is not particularly restricted, it is preferable that it is not less than 10 weight %. When content of hydrogen peroxide in the cleaning solution is less than 10 weight %, cleaning effect degrades and sufficient cleaning effect may not be obtained. Further, hydrogen peroxide is preferably not more than 30 weight % because it can be purchased easily. Hydrogen peroxide exceeding 30 weight % is difficult to obtain commercially, and increases manufacturing cost.

Further, it is preferable that the cleaning solution includes ammonia. Thus, a solution including hydrogen peroxide and ammonia (mixed solution containing hydrogen peroxide, ammonia, and water) is suitably used. By containing ammonia, the cleaning solution can have improved cleaning effect. As a result, it is possible to remove the plating solution residue remaining in the gap between the protrudent electrode and the insulating protecting film more efficiently. Thus, by using an aqueous solution including hydrogen peroxide and ammonia, high cleaning effect can be obtained. Further, it is possible to efficiently remove the plating solution residue remaining in the gap between the protrudent electrode and the insulating protecting film.

Although content of ammonia contained in the cleaning solution is not particularly restricted, not more than 14 weight % is preferable. When content of ammonia exceeds 14 weight %, hydrogen peroxide tends decompose rapidly. Thus, with a cleaning solution including ammonia within a range of more than 0 to not more than 14 weight %, the hydrogen peroxide will not decompose rapidly and high cleaning effect can be obtained.

Further, it is preferable that the cleaning solution further includes a chelating agent. By containing the chelating agent, the chelating agent in the cleaning solution forms a chelate with plating solution residue. By this, it is possible to efficiently remove the plating solution residue remaining in the gap between the protrudent electrode and the insulating protecting film. When the Ni bump 6 is formed as the protrudent electrode, it is preferable that the cleaning solution includes a chelating agent which can form a chelate with Ni. As the chelating agent, for example, ethylenediaminetetraacetic acid (hereinbelow referred to as EDTA) is used suitably.

Content of the chelating agent in the cleaning solution is set suitably according to the type of chelating agent used, and is not particularly restricted. However, when the chelating agent, for example, such as EDTA is used, it is preferable that the content is not more than 5 weight % and, more preferably, in a range of not less than 1 weight % to not more than 5 weight %, because EDTA is hard to dissolve in the solution and cleaning cost tends to increase.

In the present embodiment, as the cleaning solution used to remove the plating solution residue, concretely, a mixed solution of hydrogen peroxide and water; a mixed solution of hydrogen peroxide, ammonia, and water; a mixed solution of hydrogen peroxide, chelating agent, and water; and a mixed solution of hydrogen peroxide, ammonia, chelating agent, and water etc. are used suitably.

As the cleaning solution, for example, an aqueous solution which is composed of, not less than 10 weight % to not more than 30 weight % of hydrogen peroxide, not more than 14 weight % of ammonia, and not less than 56 weight % to not more than 90 weight % of water (note that, the total of these proportions is 100 weight %) is used. Further, as the cleaning solution, for example, an aqueous solution which is composed of not less than 10 weight % to not more than 30 weight % of hydrogen peroxide, not more than 14 weight % of ammonia, not more than 5 weight % of EDTA, not less than 51 weight % to not more than 90 weight % of water (note that, the total of these proportions is 100 weight %) Further, as the cleaning solution, for example, an aqueous solution which is composed of not less than 10 weight % to not more than 30 weight % of hydrogen peroxide, not less than 5 weight % to not more than 14 weight % of ammonia, not less than 1 weight % to not more than 5 weight % of EDTA, not less than 51 weight % to not more than 90 weight % of water (note that, the total of these proportion is 100 weight %) is used suitably.

By using the foregoing cleaning solution, the cleaning solution enters the narrow gap between the protrudent electrode and the protecting film, or a narrow gap between the noble metal coating and the protecting film when a noble metal coating such as Au thin film is formed on a surface of the protrudent electrode. Further, the cleaning solution melts and removes the plating solution residue remaining in the gap such as nickel sulfate and sodium hypophosphite.

Here, the method for manufacturing the semiconductor device according to the present embodiment is described with reference to FIG. 1(a) to FIG. 1(f) through FIG. 4 in order of manufacturing steps.

Steps of FIG. 1(a) to FIG. 1(e) are the same as those of the foregoing embodiment. In the present embodiment, the semiconductor substrate 1 on which the Ni bump 6 was formed is immersed in a substitution Au plating solution. Thereafter, pure water cleaning is performed, and as shown in FIG. 1(e), the Au layer 9 is formed on the Ni bump 6. Further, the semiconductor substrate 1 on which the Au layer 9 was formed is immersed in the cleaning solution containing hydrogen peroxide for 10 minutes. Thereafter, by performing pure water cleaning for about 5 minutes, the plating solution residue 8 remaining in the narrow gap 7 between the Ni bump 6 and the protecting film 3 is removed.

As the cleaning solution, a mixture of 30 weight % of an aqueous solution of hydrogen peroxide, 28 weight % of an aqueous solution of ammonia, pure water, and EDTA of the following composition was used.
(Composition of the Cleaning Solution)
30% aqueous solution of hydrogen peroxide 6250 ml
28% aqueous solution of ammonia 2000 ml
pure water 5000 ml
EDTA 250 g The content of hydrogen peroxide, ammonia, EDTA in the cleaning solution were 13.9 weight %, 4.1 weight %, and 1.9 weight % respectively.

Thus, as shown in FIG. 1(f) and FIG. 2, it was possible to remove the plating solution residue 8 remaining in the narrow gap 7 between the Ni bump 6 and the protecting film 3 (that is, the narrow gap between the Au layer 9 on the Ni bump 6 and the protecting film 3) which could not be removed completely by the pure water cleaning alone before cleaning with the cleaning solution. As a result, it was possible to obtain the semiconductor device in which the plating solution residue 8 in the narrow gap 7 between the Ni bump 6 having the Au layer 9 on the electrode pad 2 and the protecting film 3 was removed, and the Au layer 9 is formed on the Ni bump 6.

Note that, in the present embodiment, cleaning with the cleaning solution is performed as the step of removing residue, after substitution Au plating. However, when the metal or the metallic compound coating formed by non-electrolytic plating does not form an oxide coating in the opening 3a of the protecting film 3 on the electrode pad 2, cleaning with the cleaning solution may be performed before substitution Au plating.

In this way, forming the bump on the electrode pad 2 is completed. The bump formed in this manner can be mounted on a TCP by ILB, or mounted by flip-chip using anisotropic conductive resin, and allows fine pitch terminals to be connected at once regardless of the number of the terminals. Thus, the present embodiment also confirmed the effect of the present invention, i.e., the effect of removing the plating solution residue 8 in the narrow gap 7 between the Ni bump 6 having the Au layer 9 thereon and the protecting film 3. That is, a TCP made up of the semiconductor device obtained in the present embodiment was examined by PCT (pressure cooker test) in which the TCP was preserved at 121° C. and $2.026 \times 10^5$ Pa, and an electrical test was performed in every 100 hours.

Thus, also in the present embodiment, in order to put the semiconductor device for use in TCP, after performing the foregoing step, the semiconductor substrate 1 was immersed in a non-electrolytic Au plating solution mainly containing gold sodium sulfite to perform non-electrolytic Au plating by a wet process. Thereafter, by performing pure water cleaning, the Au layer 9 having an about 1 $\mu$m thickness was formed on the Ni bump 6.

In the present embodiment, the plating solution residue 8 in the narrow gap 7 between the Ni bump 6 and the protecting film 3 was removed only after substitution Au plating. However, as described in the foregoing embodiment, the ultrasonic cleaning may be performed in pure water after non-electrolytic Au plating. That is, the gap 7 may further be cleaned after non-electrolytic Au plating.

Also in the present embodiment, for the reason described in the foregoing embodiment, it is preferable that the step of removing the residue is performed after substitution Au plating. Also, when non-electrolytic Au plating is performed after substitution Au plating, it is preferable that the step of removing the residue is performed before non-electrolytic Au plating (after substitution Au plating, before non-electrolytic Au plating).

According to the foregoing step, it was possible to obtain the semiconductor device in which the plating solution residue 8 in the narrow gap 7 between the electrode pad 2 and the protecting film 3 was removed, and the Ni/Au bump with the Au layer 9 having enough thickness to form an Au/Sn eutectic alloy is formed on the electrode pad 2.

Next, after eutectic bonding to the inner lead of the tape carrier as in the first embodiment, the semiconductor device was sealed. Then, the plating solution residue 8 was removed by cleaning after substitution Au plating, and a TCP using the semiconductor device with the bump further processed by non-electrolytic Au plating was obtained.

The TCP was examined by the PCT (121° C., $2.026 \times 10^5$ Pa). As a result, in an uncleaned TCP which was used as a reference, the plating solution residue 8 melted and leaked within 100 hours, and a leaking defect between terminals occurred. However, in the TCP obtained in the present embodiment, a leaking defect between terminals did not occur even after 300 hours, and the effect of improved moisture resistance was obtained.

As described above, according to the present embodiment, it was possible to obtain the following advantages. That is, pure water cleaning was performed after non-electrolytic Ni plating, and the step of removing the plating solution residue was performed by cleaning with the cleaning solution, so that it was possible to remove the plating solution residue 8 remaining in the narrow gap 7 between the Ni/Au bump (that is, the Ni bump 6 having the Au layer 9 thereon) and the protecting film 3 which could not have been removed completely by pure water cleaning. This greatly improved moisture resistance of the semiconductor device. As a result, it was possible to improve reliability of the semiconductor device in which the protrudent electrode (Ni bump 6) was formed by non-electrolytic plating.

As described above, as with the method of the first embodiment, a method for manufacturing the semiconductor device according to the present embodiment is to manufacture a semiconductor device including an electrode pad formed on a semiconductor substrate; an insulating protecting film, having an opening, formed on the electrode pad with a portion of the electrode pad exposed in the opening; and a protrudent electrode (a metal bump formed by non-electrolytic plating (NiP, NiB etc.), or a metal bump on which an antioxide film made of a noble metal thin film such as an Au thin film is formed) formed in the opening of the insulating protecting film so as to cover the opening, wherein the method includes a step of forming the protrudent electrode by non-electrolytic plating in the opening of the insulating protecting film which is formed on the electrode pad provided on the semiconductor substrate; and a step of removing a plating solution residue in the gap between the protrudent electrode and the insulating protecting film.

According to the method, as described in the foregoing embodiment, compared with the case where the protrudent electrode is formed by electrolytic plating, manufacturing steps can be simplified and equipment investment can be reduced. Thus, this method can reduce cost while having advantageous characteristics such as high throughput and finer pitch. At the same time, defects such as leaking between terminals can be prevented, and a highly reliable semiconductor device having improved moisture resistance can be manufactured.

In the present embodiment, the step of removing the plating solution residue is the cleaning step with a cleaning solution. Further, the cleaning solution is a solution containing at least hydrogen peroxide.

According to the method, the cleaning solution flows into the narrow gap between the protrudent electrode and the insulating protecting film, and it is possible to melt and remove the plating solution residue such as nickel sulfate or sodium hypophosphite which was trapped when performing non-electrolytic plating. Thus, according to the method, it is possible to remove the plating solution residue remaining in the gap between the protrudent electrode and the insulating protecting film.

As the cleaning solution, a mixed solution of hydrogen peroxide, ammonia, and water is suitably used. In this case, it is preferable that the cleaning solution is composed of 10 to 30 weight % of hydrogen peroxide, 0 to 14 weight % of ammonia, and 56 to 90 weight % of water, and the total of these proportions is 100 weight %. Further, it is more preferable that the cleaning solution includes a chelating agent which forms a chelate with a metal. In this case, it is preferable that the cleaning solution is composed of 10 to 30 weight % of hydrogen peroxide, 0 to 14 weight % of ammonia, 0 to 5 weight % of ethylenediaminetetraacetic acid, 51 to 90 weight % of water, and the total of these proportions is 100 weight %.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device, said method comprising:
   a step of forming a protrudent electrode by non-electrolytic plating in an opening of an insulating protecting film which is formed on an electrode pad provided on a semiconductor substrate; and
   a step of removing a plating solution residue remaining in a gap between the protrudent electrode and the insulating protecting film.

2. The method for manufacturing the semiconductor device set forth in claim 1, wherein:
   when the protrudent electrode formed by non-electrolytic plating is made of a material which forms an oxide coating, said method further comprises a step of forming a noble metal film on a surface of the protrudent electrode by substitution plating, and
   said step of removing the plating solution residue is performed after said step of forming a noble metal film.

3. The method for manufacturing the semiconductor device set forth in claim 1, wherein:
   when the protrudent electrode formed by non-electrolytic plating is made of a material which forms an oxide coating, said method further comprises a step of forming a noble metal film on a surface of the protrudent electrode by non-electrolytic plating, and
   said step of removing the plating solution residue is performed before performing the non-electrolytic plating in the step of forming a noble metal film.

4. The method for manufacturing the semiconductor device set forth in claim 1, wherein:
   when the protrudent electrode formed by non-electrolytic plating is made of a material other than the material which forms an oxide coating, said step of removing the plating solution residue is performed after said step of forming a protrudent electrode.

5. The method for manufacturing the semiconductor device set forth in claim 4, said method further comprising:
   a step of forming a noble metal film on a surface of the protrudent electrode by substitution plating; and
   a step of removing the plating solution residue, resulted from the substitution plating, remaining in the gap between said protrudent electrode and said insulating protecting film.

6. The method for manufacturing the semiconductor device set forth in claim 4, said method further comprising a step of forming a noble metal film on a surface of the protrudent electrode by non-electrolytic plating.

7. The method for manufacturing the semiconductor device set forth in claim 1, wherein, when the protrudent electrode formed by non-electrolytic plating is made of a material other than a material which forms an oxide coating, and a noble metal film is formed on a surface of the protrudent electrode by substitution plating, said step of removing a plating solution residue is performed after the noble metal film is formed.

8. The method for manufacturing the semiconductor device set forth in claim 1, wherein said plating solution residue is removed by applying an ultrasonic wave in a cleaning solution.

9. The method for manufacturing the semiconductor device set forth in claim 8, wherein a frequency of said ultrasonic wave is not less than 950 kHz.

10. The method for manufacturing the semiconductor device set forth in claim 8, wherein said cleaning solution includes a surfactant.

11. The method for manufacturing the semiconductor device set forth in claim 10, wherein said surfactant is a nonionic surfactant.

12. The method for manufacturing the semiconductor device set forth in claim 1, wherein said plating solution residue is removed by cleaning in a cleaning solution containing hydrogen peroxide.

13. The method for manufacturing the semiconductor device set forth in claim 12, wherein said cleaning solution contains not less than 10 weight % of hydrogen peroxide.

14. The method for manufacturing the semiconductor device set forth in claim 12, wherein said cleaning solution further contains a chelating agent.

15. The method for manufacturing the semiconductor device set forth in claim 14, wherein said chelating agent is ethylenediaminetetraacetic acid, and said cleaning solution contains ethylenediaminetetraacetic acid in a range of more than 0 weight % and not more than 5 weight %.

16. The method for manufacturing the semiconductor device set forth in claim 12, wherein said cleaning solution is an aqueous solution containing hydrogen peroxide and ammonia.

17. The method for manufacturing the semiconductor device set forth in claim 16, wherein said cleaning solution contains ammonia in a range of more than 0 weight % and not more than 14 weight %.

18. The method for manufacturing the semiconductor device set forth in claim 16, wherein said cleaning solution further contains a chelating agent.

19. The method for manufacturing the semiconductor device set forth in claim 18, wherein said chelating agent is ethylenediaminetetraacetic acid, and said cleaning solution contains ethylenediaminetetraacetic acid in a range of more than 0 weight % and not more than 5 weight %.

20. The method for manufacturing the semiconductor device set forth in claim 12, wherein said cleaning solution has a composition containing: not less than 10 weight % to not more than 30 weight % of hydrogen peroxide; not more than 14 weight % of ammonia; and not less than 56 weight % to not more than 90 weight % of water, a total of these proportions being 100 weight %.

21. The method for manufacturing the semiconductor device set forth in claim 12, wherein said cleaning solution has a composition containing: not less than 10 weight % to not more than 30 weight % of hydrogen peroxide; not more than 14 weight % of ammonia; not more than 5 weight % of ethylenediaminetetraacetic acid; and not less than 51 weight % to not more than 90 weight % of water, a total of these proportions being 100 weight %.

\* \* \* \* \*